US008668356B2

(12) United States Patent
Chowdhury et al.

(10) Patent No.: US 8,668,356 B2
(45) Date of Patent: Mar. 11, 2014

(54) LIGHTWEIGHT HEAT SINKS AND LED LAMPS EMPLOYING SAME

(75) Inventors: Ashfaqul I. Chowdhury, Broadview Heights, OH (US); Gary R. Allen, Chesterland, OH (US); Joshua I. Rintamaki, Westlake, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 321 days.

(21) Appl. No.: 12/979,529

(22) Filed: Dec. 28, 2010

(65) Prior Publication Data

US 2011/0242817 A1 Oct. 6, 2011

Related U.S. Application Data (60) Provisional application No. 61/320,431, filed on Apr. 2, 2010.

(51) Int. Cl.
*F21V 21/00* (2006.01)
*F21V 29/00* (2006.01)

(52) U.S. Cl.
USPC ..................... 362/249.02; 362/373

(58) Field of Classification Search
USPC .............. 362/294, 373, 249.02, 800; 438/122
See application file for complete search history.

(56) References Cited

U.S. PATENT DOCUMENTS

| 6,965,513 | B2 * | 11/2005 | Montgomery et al. .. 361/679.46 |
| 7,569,425 | B2 | 8/2009 | Huang et al. |
| 2003/0117770 | A1 * | 6/2003 | Montgomery et al. ....... 361/687 |
| 2003/0198021 | A1 | 10/2003 | Freedman |
| 2005/0116336 | A1 * | 6/2005 | Chopra et al. ................ 257/720 |
| 2008/0074871 | A1 * | 3/2008 | Meis et al. ..................... 362/218 |

FOREIGN PATENT DOCUMENTS

| KR | 2011 0008822 | 1/2011 |
| WO | WO 2005/028549 | 5/2005 |
| WO | WO 2006/117447 | 11/2006 |

OTHER PUBLICATIONS

PCT Search Report from PCT/US2011/028934.

* cited by examiner

*Primary Examiner* — Thomas Sember
(74) *Attorney, Agent, or Firm* — Fay Sharpe LLP (57) ABSTRACT

A heat sink includes a thermally conductive layer comprising at least one of fullerenes and nanotubes disposed in a polymeric host. The thermally conductive layer may be disposed on a heat sink body, which may be thermally insulating and/or plastic, and may include surface area enhancing heat radiating structures, such as fins, with the thermally conductive layer being disposed over at least the surface area enhancing heat radiating structures. A light emitting diode (LED)-based lamp embodiment includes the heat sink and an LED module including one or more LED devices secured with and in thermal communication with the heat sink. A method embodiment includes forming the heat sink body and disposing the thermally conductive layer on the heat sink body. The disposing may comprise spray coating. An external energy field may be applied during spray coating to impart a non-random orientation to nanotubes in the polymeric host.

12 Claims, 10 Drawing Sheets

LIGHTWEIGHT HEAT SINKS AND LED LAMPS EMPLOYING SAME

This application claims the benefit of U.S. Provisional Application No. 61/320,431 filed Apr. 2, 2010. U.S. Provisional Application No. 61/320,431 filed Apr. 2, 2010 is incorporated herein by reference in its entirety.

BACKGROUND

The following relates to the illumination arts, lighting arts, solid state lighting arts, thermal management arts, and related arts.

Incandescent, halogen, and high intensity discharge (HID) light sources have relatively high operating temperatures, and as a consequence heat egress is dominated by radiative and convective heat transfer pathways. For example, radiative heat egress goes with temperature raised to the fourth power, so that the radiative heat transfer pathway becomes superlinearly more dominant as operating temperature increases. Accordingly, thermal management for incandescent, halogen, and HID light sources typically amounts to providing adequate air space proximate to the lamp for efficient radiative and convective heat transfer. Typically, in these types of light sources, it is not necessary to increase or modify the surface area of the lamp to enhance the radiative or convective heat transfer in order to achieve the desired operating temperature of the lamp.

Light-emitting diode (LED)-based lamps, on the other hand, typically operate at substantially lower temperatures for device performance and reliability reasons. For example, the junction temperature for a typical LED device should be below 200° C., and in some LED devices should be below 100° C. or even lower. At these low operating temperatures, the radiative heat transfer pathway to the ambient is weak, so that convective and conductive heat transfer to ambient typically dominate. In LED light sources, the convective and radiative heat transfer from the outside surface area of the lamp or luminaire can be enhanced by the addition of a heat sink.

A heat sink is a component providing a large surface for radiating and convecting heat away from the LED devices. In a typical design, the heat sink is a relatively massive metal element having a large engineered surface area, for example by having fins or other heat dissipating structures on its outer surface. The large mass of the heat sink efficiently conducts heat from the LED devices to the heat fins, and the large area of the heat fins provides efficient heat egress by radiation and convection. For high power LED-based lamps it is also known to employ active cooling using fans or synthetic jets or heat pipes or thermo-electric coolers or pumped coolant fluid to enhance the heat removal.

BRIEF SUMMARY

In some embodiments disclosed herein as illustrative examples, a heat sink includes a thermally conductive layer comprising at least one of fullerenes and nanotubes disposed in a polymeric host. The heat sink may further include a heat sink body, which may be thermally insulating and/or plastic, on which the thermally conductive layer is disposed. The heat sink body may include surface area enhancing heat radiating structures, such as fins, with the thermally conductive layer being disposed over at least the surface area enhancing heat radiating structures.

In some embodiments disclosed herein as illustrative examples, a light emitting diode (LED)-based lamp includes a heat sink as set forth in the immediately preceding paragraph, and an LED module including one or more LED devices, wherein the LED module is secured with and in thermal communication with the heat sink to form the LED-based lamp, which may have an A-line bulb configuration. In other lamp embodiments, the heat sink body comprises a hollow generally conical heat sink body and the heat sink comprises a hollow generally conical heat sink in which the thermally conductive layer is disposed over at least an outer surface of the hollow generally conical heat sink body, and the LED-based lamp is an MR- or PAR-based lamp.

In some embodiments disclosed herein as illustrative examples, a method comprises forming a heat sink body and disposing a thermally conductive layer on the heat sink body, the thermally conductive layer comprising nanotubes disposed in a polymeric host. The forming may comprise molding the heat sink body as a molded plastic heat sink body. The disposing may comprise spray coating the thermally conductive layer on the heat sink body. Optionally, the disposing may further comprise applying an external energy field during the spray coating to impart a non-random orientation to the nanotubes disposed in the polymeric host.

BRIEF DESCRIPTION OF THE DRAWINGS

FIG. 7 diagrammatically shows a variant heat sink embodiment, and a spray coating manufacturing approach there of.

DETAILED DESCRIPTION OF PREFERRED EMBODIMENTS

In the case of incandescent, halogen, and HID light sources, all of which are thermal emitters of light, the heat transfer to the air space proximate to the lamp is managed by design of the radiative and convective thermal paths in order to achieve an elevated target temperature during operation of the light source. In contrast, in the case of LED light sources, photons are not thermally-excited, but rather are generated by recombination of electrons with holes at the p-n junction of a semiconductor. Both the performance and the life of the light source are optimized by minimizing the operating temperature of the p-n junction of the LED, rather than operating at an elevated target temperature. By providing a heat sink with fins or other surface area-increasing structures, the surface for convective and radiative heat transfer is enhanced.

Figure 1:
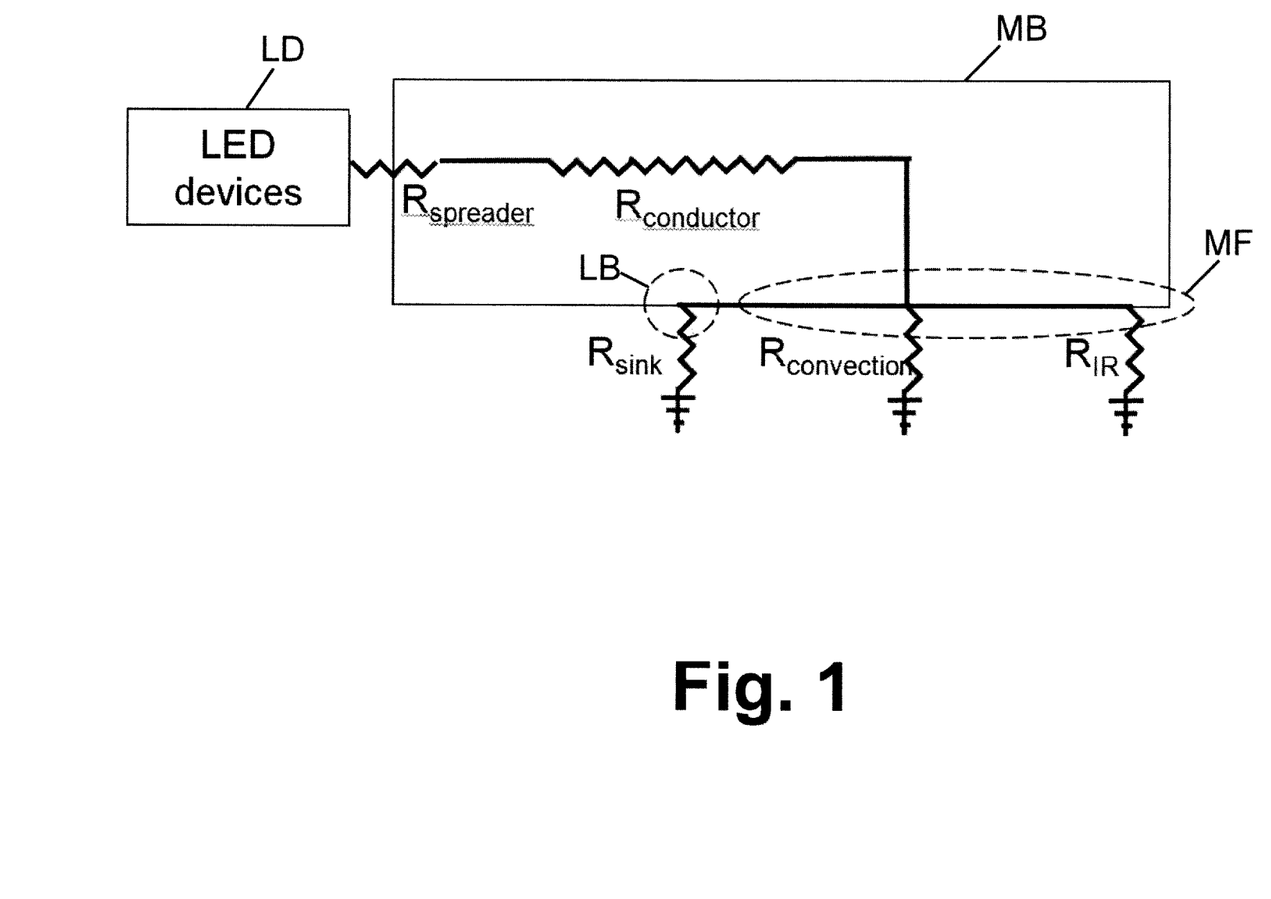
FIGS. 1 and 2 diagrammatically show thermal models for a conventional heat sink employing a metal heat sink component (FIG. 1) and for a heat sink as disclosed herein (FIG. 2).

With reference to FIG. 1, a metal heat sink MB with fins is diagrammatically indicated by a block, and the fins MF of the heat sink are diagrammatically indicated by a dashed oval. The surface through which heat is transferred into the surrounding ambient by convection and/or radiation is referred to herein as the heat sinking surface (e.g., the fins MF), and should be of large area to provide sufficient heat sinking for LED devices LD in steady state operation. Convective and radiative heat sinking into the ambient from the heat sinking surface MF can be modeled by thermal resistances $R_{convection}$ and $R_{IR}$, respectively or, equivalently, by thermal conductances. The resistance $R_{convection}$ models convection from the outside surface of the heat sink to the proximate ambient by natural or forced air flow. The resistance $R_{IR}$ models infrared (IR) radiation from the outside surface of the heat sink to the remote ambient. Additionally, a thermal conduction path (denoted in FIG. 1 by the resistances $R_{spreader}$ and $R_{conductor}$) is in series between the LED devices LD and the heat sinking surface MF, which represents thermal conduction from the LED devices LD to the heat sinking surface MF. A high thermal conductance for this series thermal conduction path ensures that heat egress from the LED devices to the proximate air via the heat sinking surface is not limited by the series thermal conductance. This is typically achieved by constructing the heat sink MB as a relatively massive block of metal having a finned or otherwise enhanced surface area MF defining the heat sinking surface—the metal heat sink body provides the desired high thermal conductance between the LED devices and the heat sinking surface. In this design, the heat sinking surface is inherently in continuous and intimate thermal contact with the metal heat sink body that provides the high thermal conductance path.

Thus, conventional heat sinking for LED-based lamps includes the heat sink MB comprising a block of metal (or metallic alloy) having the large-area heat sinking surface MF exposed to the proximate air space. The metal heat sink body provides a high thermal conductance pathway $R_{conductor}$ between the LED devices and the heat sinking surface. The resistance $R_{conductor}$ in FIG. 1 models conduction through the metal heat sink body MB. The LED devices are mounted on a metal-core circuit board or other support including a heat spreader, and heat from the LED devices conducts through the heat spreader to the heat sink. This is modeled by the resistance $R_{spreader}$.

In addition to heat sinking into the ambient via the heat sinking surface (resistances $R_{convection}$ and $R_{IR}$), there is typically also some thermal egress (i.e., heat sinking) through the Edison base or other lamp connector or lamp base LB (diagrammatically indicated in the model of FIG. 1 by a dashed circle). This thermal egress through the lamp base LB is represented in the diagrammatic model of FIG. 1 by the resistance $R_{sink}$, which represents conduction through a solid or a heat pipe to the remote ambient or to the building infrastructure. However, it is recognized herein that in the common case of an Edison-type base, the thermal conductance and temperature limits of the base LB will limit the heat flux through the base to about 1 watt. In contrast, for LED-based lamps intended to provide illumination for interior spaces such as rooms, or for outdoor lighting, the heat output to be sinked is typically about 10 watts or higher. Thus, it is recognized herein that the lamp base LB cannot provide the primary heat sinking pathway. Rather, heat egress from the LED devices LD is predominantly via conduction through the metal heat sink body to the outer heat sinking surface of the heat sink where the heat is sinked into the surrounding ambient by convection ($R_{convection}$) and (to a lesser extent) radiation ($R_{IR}$). The heat sinking surface may be finned (e.g., fins MF in diagrammatic FIG. 1) or otherwise modified to enhance its surface area and hence increase the heat sinking.

Such heat sinks have some disadvantages. For example, the heat sinks are heavy due to the large volume of metal or metal alloy comprising the heat sink MB. A heavy metal heat sink can put mechanical stress on the base and socket which can result in failure and, in some failure modes, an electrical hazard. Another issue with such heat sinks is manufacturing cost. Machining a bulk metal heat sink component can be expensive, and depending on the choice of metal the material cost can also be high. Moreover, the heat sink is sometimes also used as a housing for electronics, or as a mounting point for the Edison base, or as a support for the LED devices circuit board. These applications call for the heat sink to be machined with some precision, which again increases manufacturing cost.

The inventors have analyzed these problems using the simplified thermal model shown in FIG. 1. The thermal model of FIG. 1 can be expressed algebraically as a series-parallel circuit of thermal impedances. In the steady state, all transient impedances, such as the thermal mass of the lamp itself, or the thermal masses of objects in the proximate ambient, such as lamp connectors, wiring, and structural mounts, may be treated as thermal capacitances. The transient impedances (i.e., thermal capacitances) may be ignored in steady state, just as electrical capacitances are ignored in DC electrical circuits, and only the resistances need be considered. The total thermal resistance $R_{thermal}$ between the LED devices and the ambient may be written as $$R_{thermal} = R_{spreader} + R_{conduction} + \left(\frac{1}{R_{sink}} + \frac{1}{R_{convection}} + \frac{1}{R_{IR}}\right)^{-1}$$

where: $R_{sink}$ is the thermal resistance of heat passing through the Edison connector (or other lamp connector) to the "ambient" electrical wiring; $R_{convection}$ is the thermal resistance of heat passing from the heat sinking surface into the surrounding ambient by convective heat transfer; $R_{IR}$ is the thermal resistance of heat passing from the heat sinking surface into the surrounding ambient by radiative heat transfer; and $R_{spreader}+R_{conduction}$ is the series thermal resistance of heat passing from the LED devices through the heat spreader ($R_{spreader}$) and through the metal heat sink body ($R_{conduction}$) to reach the heat sinking surface. It should be noted that for the term $1/R_{sink}$, the corresponding series thermal resistance is not precisely $R_{spreader}+R_{conduction}$ since the series thermal pathway is to the lamp connector rather than to the heat sinking surface—however, since the thermal conductance $1/R_{sink}$ through the base connector is small for a typical lamp this error is negligible. Indeed, a simplified model neglecting heat sinking through the base entirely can be written as $$R_{thermal} = R_{spreader} + R_{conduction} + \left(\frac{1}{R_{convection}} + \frac{1}{R_{IR}}\right)^{-1}.$$

This simplified equation demonstrates that the series thermal resistance $R_{conduction}$ through the heat sink body is a controlling parameter of the thermal model. Indeed, this is a justification for the conventional heat sink design employing the bulk metal heat sink MB—the heat sink body provides a very low value for the series thermal resistance $R_{conduction}$. In view of the foregoing, it is recognized that it would be desirable to achieve a heat sink that has a low series thermal resistance $R_{conduction}$, while simultaneously having reduced weight (and, preferably, reduced cost) as compared with a conventional heat sink.

One way this might be accomplished is to enhance thermal heat sinking $R_{sink}$ through the base, so that this pathway can be enhanced to provide a heat sinking rate of 10 watts or higher. However, in retrofit light source applications in which an LED lamp is used to replace a conventional incandescent or halogen or fluorescent or HID lamp, the LED replacement lamp is mounted into a conventional base or socket or luminaire of the type originally designed for an incandescent, halogen, or HID lamp. For such a connection, the thermal resistance $R_{sink}$ to the building infrastructure or to the remote ambient (e.g. earth ground) is large compared with $R_{convection}$ or $R_{IR}$ so that the thermal path to ambient by convection and radiation dominates.

Additionally, due to the relatively low steady state operating temperature of the LED assembly, the radiation path is typically dominated by the convection path (that is, $R_{convection} \ll R_{IR}$). Therefore, the dominant thermal path for a typical LED-based lamp is the series thermal circuit comprising $R_{conduction}$ and $R_{convection}$. It is therefore desired to provide a low series thermal resistance $R_{conduction} + R_{convection}$, while reducing the weight (and, preferably, cost) of the heat sink.

The present inventors have carefully considered from a first-principles viewpoint the problem of heat removal in an LED-based lamp. It is recognized herein that, of the parameters typically considered of significance (heat sink volume, heat sink mass to conductivity ratio, heat sink surface area, and conductive heat removal and sinking through the base), the two dominant design attributes are the thermal conductance of the pathway between the LEDs and the heat sink (that is, $R_{conduction}$), and the outside surface area of the heat sink for convective and radiative heat transfer to the ambient (which affects $R_{convection}$ and $R_{IR}$).

Further analysis can proceed by a process of elimination. The heat sink volume is of importance only insofar as it affects heat sink mass and heat sink surface area. The heat sink mass is of importance in transient situations, but does not strongly affect steady-state heat removal performance, which is what is of interest in a continuously operating lamp, except to the extent that the metal heat sink body provides a low series resistance $R_{conduction}$. The heat sinking path through the base of a replacement lamp, such as a PAR or MR or reflector or A-line lamp, can be of significance for lower power lamps—however, the thermal conductance of an Edison base is only sufficient to provide about 1 watt of heat sinking to the ambient (and other base types such as pin-type bases are likely to have comparable or even less thermal conductance), and hence conductive heat sinking through the base to ambient is not expected to be of principle importance for commercially viable LED-based lamps which are expected to generate heating loads up to several orders of magnitude higher at steady state.

Figure 2:
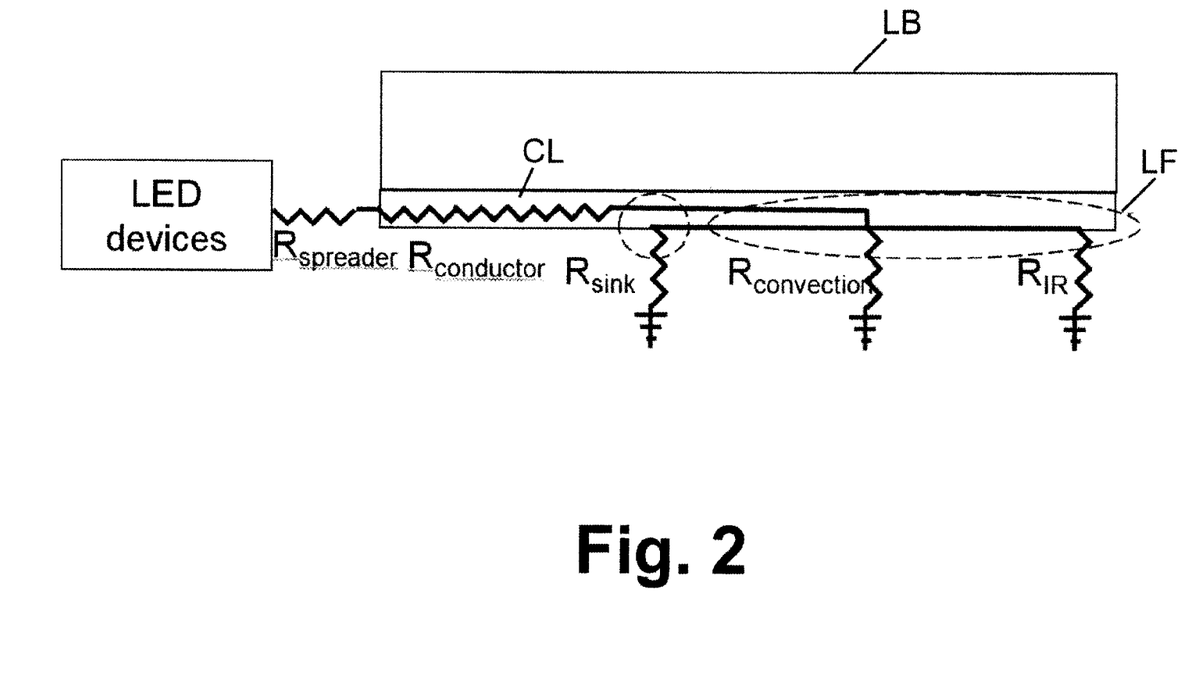

With reference to FIG. 2, based on the foregoing an improved heat sink is disclosed herein, comprising a lightweight heat sink body LB, which is not necessarily thermally conductive, and a thermally conductive layer CL disposed over the heat sink body to define the heat sinking surface. The heat sink body is not part of the thermal circuit (or, optionally, may be a minor component via some thermal conductivity of the heat sink body)—however, the heat sink body LB defines the shape of the thermally conductive layer CL that defines the heat sinking surface. For example, the heat sink body LB may have fins LF that are coated by the thermally conductive layer CL. Because the heat sink body LB is not part of the thermal circuit (as shown in FIG. 2), it can be designed for manufacturability and properties such as structural soundness and low weight. In some embodiments the heat sinking body LB is a molded plastic component comprising a plastic that is thermally insulating or has relatively low thermal conductivity.

The thermally conductive layer CL disposed over the lightweight heat sink body LB performs the functionality of the heat sinking surface, and its performance with respect to heat sinking into the surrounding ambient (quantified by the thermal resistances $R_{convection}$ and $R_{IR}$) is substantially the same as in the conventional heat sink modeled in FIG. 1. Additionally, however, the thermally conductive layer CL defines the thermal pathway from the LED devices to the heat sinking surface (quantified by the series resistance $R_{conduction}$). This also is diagrammatically shown in FIG. 2. To achieve a sufficiently low value for $R_{conduction}$, the thermally conductive layer CL should have a sufficiently large thickness (since $R_{conduction}$ decreases with increasing thickness) and should have a sufficiently low material thermal conductivity (since $R_{conduction}$ also decreases with increasing material thermal conductivity). It is disclosed herein that by suitable selection of the material and thickness of the thermally conductive layer CL, a heat sink comprising a lightweight (and possibly thermally insulating) heat sink body LB and a thermally conductive layer CL disposed over the heat sink body and defining the heat sinking surface can have heat sinking performance equal to or better than an equivalently sized and shaped heat sink of bulk metal, while simultaneously being substantially lighter, and cheaper to manufacture, than the equivalent heat sink of bulk metal. Again, it is not merely the surface area available for radiative/convective heat sinking to ambient that is determinative of the performance of the heat sink, but also the thermal conductance of heat across the outer surface defined by the heat sinking layer (that is, corresponding to the series resistance $R_{conduction}$) that is in thermal communication with the ambient. Higher surface conductance promotes more efficient distribution of the heat over the total heat sinking surface area and hence promotes the radiative and convective heat sinking to ambient.

In view of the foregoing, heat sink embodiments are disclosed herein which comprise a heat sink body and a thermally conductive layer disposed on the heat sink body at least over (and defining) the heat sinking surface of the heat sink. The material of the heat sink body has a lower thermal conductivity than the material of the thermally conductive layer. Indeed, the heat sink body can even be thermally insulating. On the other hand, the thermally conductive layer should have (i) an area and (ii) a thickness and (iii) be made of a material of sufficient thermal conductivity so that it provides radiative/convective heat sinking to the ambient that is sufficient to keep the p-n semiconductor junctions of the LED devices of the LED-based lamp at or below a specified maximum temperature, which is typically below 200° C. and sometimes below 100° C.

The thickness and material thermal conductivity of the thermally conductive layer together define a thermal sheet conductivity of the thermally conductive layer, which is analogous to an electrical sheet conductivity (or, in the inverse, an electrical sheet resistance). A thermal sheet resistance $$R_s = \frac{\rho}{d} = (\sigma \cdot d)^{-1}$$

may be defined, where $\rho$ is the thermal resistivity of the material and $\sigma$ is the thermal conductivity of the material, and d is the thickness of the thermally conductive layer. Inverting yields the thermal sheet conductance $K_s = \sigma \cdot d$. Thus, a tradeoff can be made between the thickness d and the material thermal conductivity σ of the thermally conductive layer. For high thermal conductivity materials, the thermally conductive layer can be made thin, which results in reduced weight, volume, and cost.

In embodiments disclosed herein, the thermally conductive layer is a carbon nanotube (CNT) layer which comprises carbon nanotubes disposed in a polymeric host. Some suitable CNT layers are disclosed, by way of illustrative example, in Elhard et al., Int'l Pat. Appl. WO 2009/052110 A2 published Apr. 23, 2009, which is incorporated herein by reference in its entirety, and in Heintz et al., Int'l. Pat. Appl. WO 2008/085550 A2 published Jul. 17, 2008, which is incorporated herein by reference in its entirety. A carbon nanotube is known to have very high thermal conductance along the tube and to have high electrical conductance along the tube. The CNT layers disclosed in the WO 2009/052110 A2 and WO 2008/085550 A2 comprise randomly oriented carbon nanotubes disposed in the polymer host, in which the carbon nanotubes are sufficiently close that electrical conduction across neighboring carbon nanotubes is also very high. Accordingly, the CNT layer material has a very high electrical conductivity.

To illustrate the very high thermal conductivity achievable in CNT configurations, reference is made to Berber et al., "Unusually High Thermal Conductivity of Carbon Nanotubes", Physical Review Letters vol. 84 no. 20, pages 4613-16 (2000), which is incorporated herein by reference in its entirety. Data are reported in Berber et al. for various carbon nanotubes composite characteristics. By way of example, Berber et al. FIG. 2 shows CNT thermal conductivity as a function of temperature, and find thermal conductivity peaks at 37000 W/m-K at a temperature of 100K, above which temperature the conductivity gradually decreases. At room temperature, the conductivity is about 6600 W/m-K. Berber et al. FIG. 3 show thermal conductivity data for a (10, 10) carbon nanotube as compared with a constrained graphite monolayer and as compared with the basal plane of AA graphite for temperatures between 200 and 400 K. These data show that an isolated nanotube has very similar thermal transport behavior as compared with a hypothetical isolated graphene monolayer. These data reported in Berber et al. illustrate the high thermal conductivity achievable for a CNT layer comprising carbon nanotubes disposed in a polymeric host—it is to be understood that the precise thermal characteristics of a particular CNT layer are expected to depend on various parameters such as nanotubes density and orientation (e.g., random or having some preferential orientation) in the polymeric host, nanotubes type (e.g., single-walled versus multi-walled), and so forth.

A CNT layer constructed using CNT stock such as single wall nanotubes (SWNT) or graphitized multiwall nanotubes (MWNT) have very high thermal conductivity, for example up to σ=2000 W/m·K or higher when formed as a CNT mat (where the "mat" comprises CNT material strands). More generally, it contemplated to form the thermally conductive layer of a fullerene layer comprising fullerenes (i.e., carbon nanostructures such as carbon nanotubes, Buckminster fullerenes also known as "Buckyballs", Icosahedral fullerenes, or so forth, or various mixtures of the aforementioned) in a polymer host, in which the fullerenes have a sufficiently high density in the polymer host to promote very efficient thermal conduction across neighboring fullerenes.

The heat sink body (that is, the heat sink not including the thermally conductive layer) does not strongly impact the heat removal, except insofar as it defines the shape of the thermally conductive layer that performs the heat spreading (quantified by the series resistance $R_{conduction}$ in the thermal model of FIG. 2) and defines the heat sinking surface (quantified by the resistances $R_{convection}$ and $R_{IR}$ in the thermal model of FIG. 2). The surface area provided by the heat sink body affects the subsequent heat removal via radiation and convection. As a result, the heat sink body can be chosen to achieve desired characteristics such as low weight, low cost, structural rigidity or robustness, thermal robustness (e.g., the heat sink body should withstand the operating temperatures without melting or unduly softening), ease of manufacturing, maximal surface area (which in turn controls the surface area of the thermally conductive layer), and so forth. In some illustrative embodiments disclosed herein the heat sink body is a molded plastic element, for example made of a polymeric material such as poly (methyl methacrylate), nylon, polyethylene, epoxy resin, polyisoprene, sbs rubber, polydicyclopentadiene, polytetrafluoroethulene, poly(phenylene sulfide), poly(phenylene oxide), silicone, polyketone, thermoplastics, or so forth. The heat sink body can be molded to have fins or other heat radiation/convection/surface area enhancing structures.

In the following, some illustrative embodiments are described.

Figure 3:
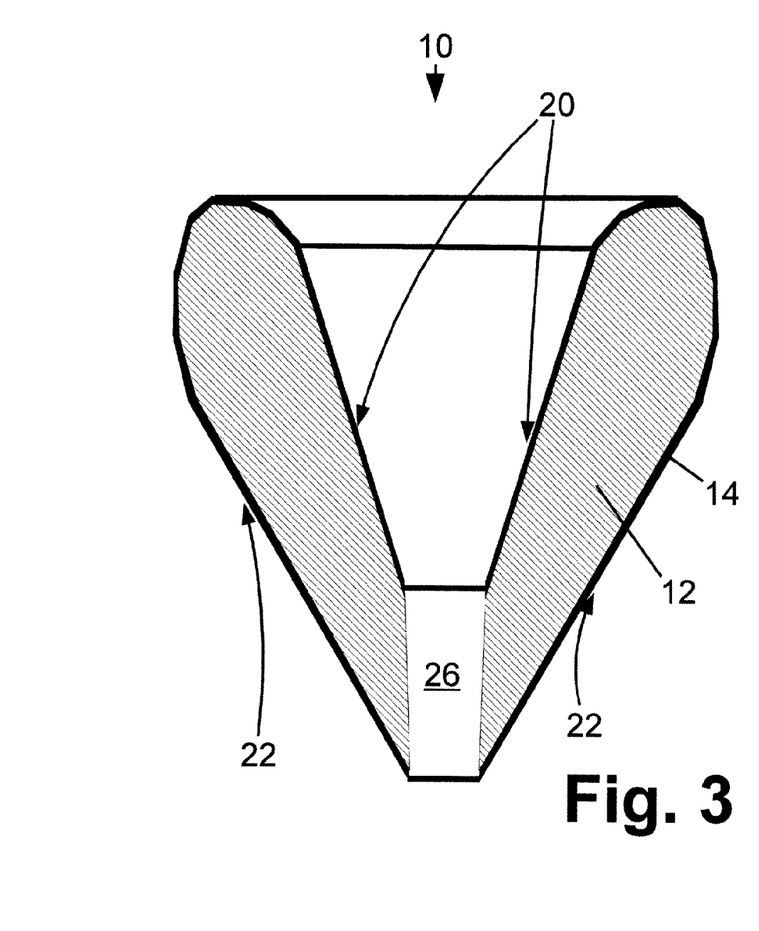
FIGS. 3 and 4 diagrammatically show side sectional and side perspective views, respectively, of a heat sink suitably used in an MR or PAR lamp.
Figure 4:
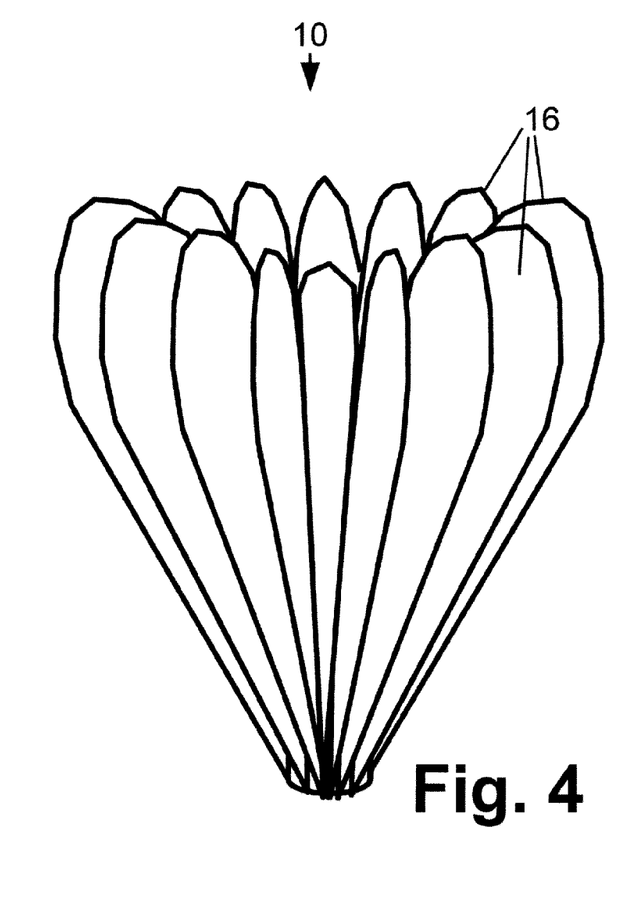

With reference to FIGS. 3 and 4, a heat sink 10 has a configuration suitable for use in an MR or PAR type LED-based lamp. The heat sink 10 includes a heat sink body 12 made of plastic or another suitable material as already described, and a thermally conductive layer 14 comprising a CNT layer disposed on the heat sink body 12. More generally, the thermally conductive layer 14 may be a fullerene layer comprising fullerenes (such as carbon nanotubes, Buckminster fullerenes also known as "Buckyballs", Icosahedral fullerenes, or so forth) disposed in a polymeric host.

As best seen in FIG. 4, the heat sink 10 has fins 16 to enhance the ultimate radiative and convective heat removal. Instead of the illustrated fins 16, other surface area enhancing structures could be used, such as multi-segmented fins, rods, micro/nano scale surface and volume features or so forth. The illustrative heat sink body 12 defines the heat sink 10 as a hollow generally conical heat sink having inner surfaces 20 and an outer surfaces 22. In the embodiment shown in FIG. 3, the thermally conductive layer 14 is disposed on both the inner surfaces 20 and the outer surfaces 22. Alternatively, the thermally conductive layer may be disposed on only the outer surfaces 22, as shown in the alternative embodiment heat sink 10' of FIG. 7.

Figure 5:
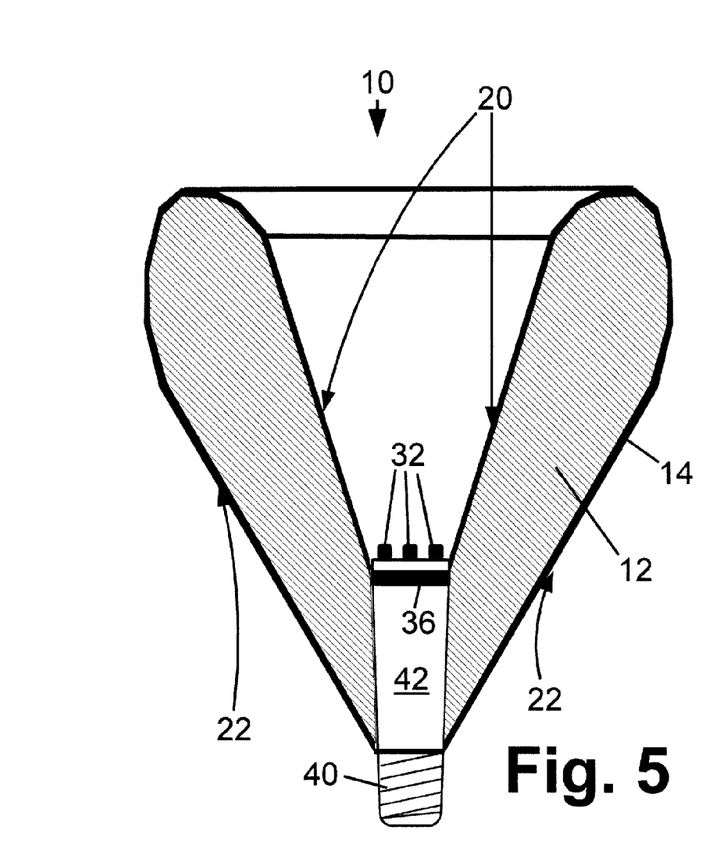
FIG. 5 diagrammatically shows a side sectional view of an MR or PAR lamp including the heat sink of FIGS. 3 and 4.
Figure 6:
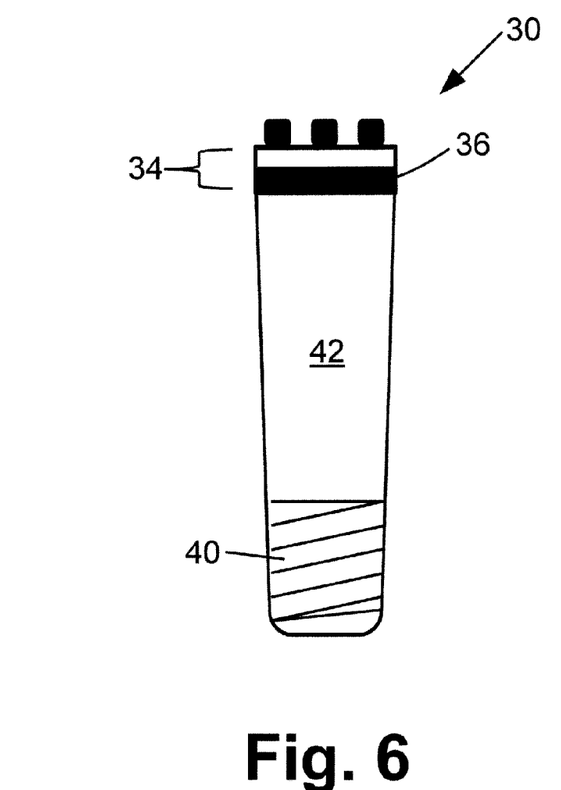
FIG. 6 diagrammatically shows a side view of the optical/electronic module of the MR or PAR lamp of FIG. 5.

With continuing reference to FIGS. 3 and 4 and with further reference to FIGS. 5 and 6, the illustrative hollow generally conical heat sink 10 includes a hollow vertex 26. An LED module 30 (shown in FIG. 6) is suitably disposed at the vertex 26, as shown in FIG. 5) so as to define an MR- or PAR-based lamp. The LED module 30 includes one or more (and in the illustrative example three) light-emitting diode (LED) devices 32 mounted on a metal core printed circuit board (MCPCB) 34 that includes a heat spreader 36, for example comprising a metal layer of the MCPCB 34. The illustrative LED module 30 further includes a threaded Edison base 40; however, other types of bases, such as a bayonet pin-type base, or a pig tail electrical connector, can be substituted for the illustrative Edison base 40. The illustrative LED module 30 further includes electronics 42. The electronics may comprise an enclosed electronics unit 42 as shown, or may be electronic components disposed in the hollow vertex 26 of the heat sink 10 without a separate housing. The electronics 42 suitably comprise power supply circuitry for converting the A.C. electrical power (e.g., 110 volts U.S. residential, 220 volts U.S. industrial or European, or so forth) to (typically lower) DC voltage suitable for operating the LED devices 32. The electronics 42 may optionally include other components, such as electrostatic discharge (ESD) protection circuitry, a fuse or other safety circuitry, dimming circuitry, or so forth.

As used herein, the term "LED device" is to be understood to encompass bare semiconductor chips of inorganic or organic LEDs, encapsulated semiconductor chips of inorganic or organic LEDs, LED chip "packages" in which the LED chip is mounted on one or more intermediate elements such as a sub-mount, a lead-frame, a surface mount support, or so forth, semiconductor chips of inorganic or organic LEDs that include a wavelength-converting phosphor coating with or without an encapsulant (for example, an ultra-violet or violet or blue LED chip coated with a yellow, white, amber, green, orange, red, or other phosphor designed to cooperatively produce white light), multi-chip inorganic or organic LED devices (for example, a white LED device including three LED chips emitting red, green, and blue, and possibly other colors of light, respectively, so as to collectively generate white light), or so forth. The one or more LED devices 32 may be configured to collectively emit a white light beam, a yellowish light beam, red light beam, or a light beam of substantially any other color of interest for a given lighting application. It is also contemplated for the one or more LED devices 32 to include LED devices emitting light of different colors, and for the electronics 42 to include suitable circuitry for independently operating LED devices of different colors to provide an adjustable color output.

The heat spreader 36 provides thermal communication from the LED devices 32 to the thermally conductive layer 14. Good thermal coupling between the heat spreader 36 and the thermally conductive layer 14 may be achieved in various ways, such as by soldering, thermally conductive adhesive, a tight mechanical fit optionally aided by high thermal conductivity pad between the LED module 30 and the vertex 26 of the heat sink 10, or so forth. Although not illustrated, it is contemplated to have the thermally conductive layer 14 be also disposed over the inner diameter surface of the vertex 26 to provide or enhance the thermal coupling between the heat spreader 36 and the thermally conductive layer 14.

Figure 7:
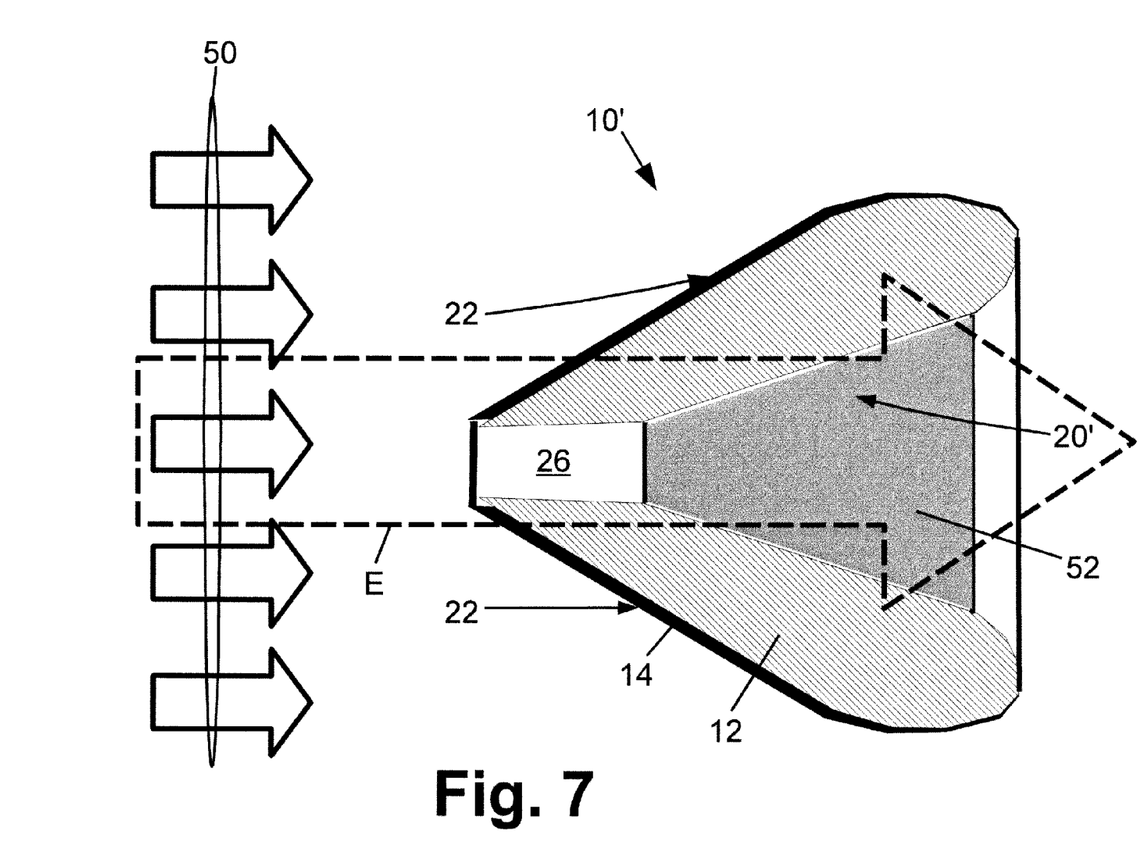

With reference to FIG. 7, a manufacturing approach is set forth. In this approach the heat sink body 12 is first formed (operation not shown) by a suitable method such as by molding, which is convenient for forming the heat sink body 12 in embodiments in which the heat sink body 12 comprises a plastic or other polymeric material. Other approaches for forming the heat sink body 12 include casting, extruding (in the case of a cylindrical heat sink, for example), or so forth. Spray coating 50 (diagrammatically indicated by arrows) is applied to coat the outer surfaces 22 with the thermally conductive coating 14 comprising fullerenes such as carbon nanotubes disposed in a polymeric host. Other coating methods such as masked dip coating or brush application or so forth can also be used. The result is a modified heat sink 10' which differs from the heat sink 10 of FIGS. 3 and 5 in that the inside surfaces 20' are not coated with the thermally conductive coating 14. This is acceptable if the thermally conductive coating 14 disposed on the outside surfaces 22 (which optionally include fins or other surface area-enhancing structures) provides sufficient ultimate radiative/convective heat sinking. In such embodiments, the inner surfaces 20 are optionally coated with a reflective coating 52 to form a collecting reflector for the MR or PAR or reflector lamp. It is also to be appreciated that the MR- or PAR or reflector lamp may include other optical components (not illustrated), such as one or more Fresnel or other lenses, one or more diffuser elements, or so forth.

If it is desired to additionally dispose the thermally conductive coating 14 on the inside surfaces 20 (as shown by way of illustrative example by the heat sink 10 of FIGS. 3 and 5), the spray coating of FIG. 7 can be repeated with the inside surfaces 22 facing the spray (that is, with the heat sink as shown in FIG. 7 turned 180°). Alternatively, another coating approach such as painting can be used which allows coating on both inside and outside surfaces 20, 22.

In general, in the thermally conductive coating 14 the fullerenes are randomly oriented in the polymeric host. This is the usual configuration, and is the case, by way of example, in the CNT layers disclosed in WO 2009/052110 A2 and WO 2008/085550 A2, both of which are incorporated herein by reference. However, in the case of anisotropic fullerenes such as carbon nanotubes, it is also contemplated to form the thermally conductive coating 14 as a CNT layer in which the carbon nanotubes are biased toward a selected orientation parallel with the plane of the thermally conductive layer 14. Such an orientation can enhance the lateral thermal conductivity as compared with the "through-layer" thermal conductivity. The thermal conductivity becomes a tensor with an in-plane value $\sigma_\parallel$ and a "through-layer" value $\sigma_\perp$. For a biasing toward the carbon nanotubes being oriented in the plane of the thermally conductive layer 14, $\sigma_\parallel > \sigma_\perp$ and the sheet conductivity becomes $K_s = \sigma_\parallel \cdot d$. If additionally the carbon nanotubes are biased toward a selected orientation parallel with the plane of the thermally conductive layer 14, then the tensor has further components (that is, the in-plane value $\sigma_\parallel$ is broken into different values for different in-plane directions), and if the selected orientation is parallel with a desired direction of thermal flow then the efficiency of ultimate radiative/convective heat sinking can be still further enhanced. One way of achieving such preferential orientation of the carbon nanotubes is by applying an electric field E (diagrammatically shown by a large arrow drawn with dashed lines) during the spray coating. More generally, an external energy field is applied during the spray coating to impart a non-random orientation to the carbon nanotubes disposed in the polymeric host. Another way of achieving preferential orientation of the carbon nanotubes is to dispose the thermally conductive layer 14 on the heat sink body 12 using painting, with the paint strokes being drawn along the preferred orientation so as to mechanically bias the carbon nanotubes toward the preferred orientation.

In some embodiments, after the thermally conductive layer 14 is disposed on the heat sink body 12 it is suitably cured by heating, ultraviolet light exposure, or so forth. In such embodiments, application of an electric field, or mechanical polishing similar to the way polyimide "alignment layers" are formed in some liquid crystal devices, may be employed to impart the preferential orientation to the nanotubes.

Figure 8:
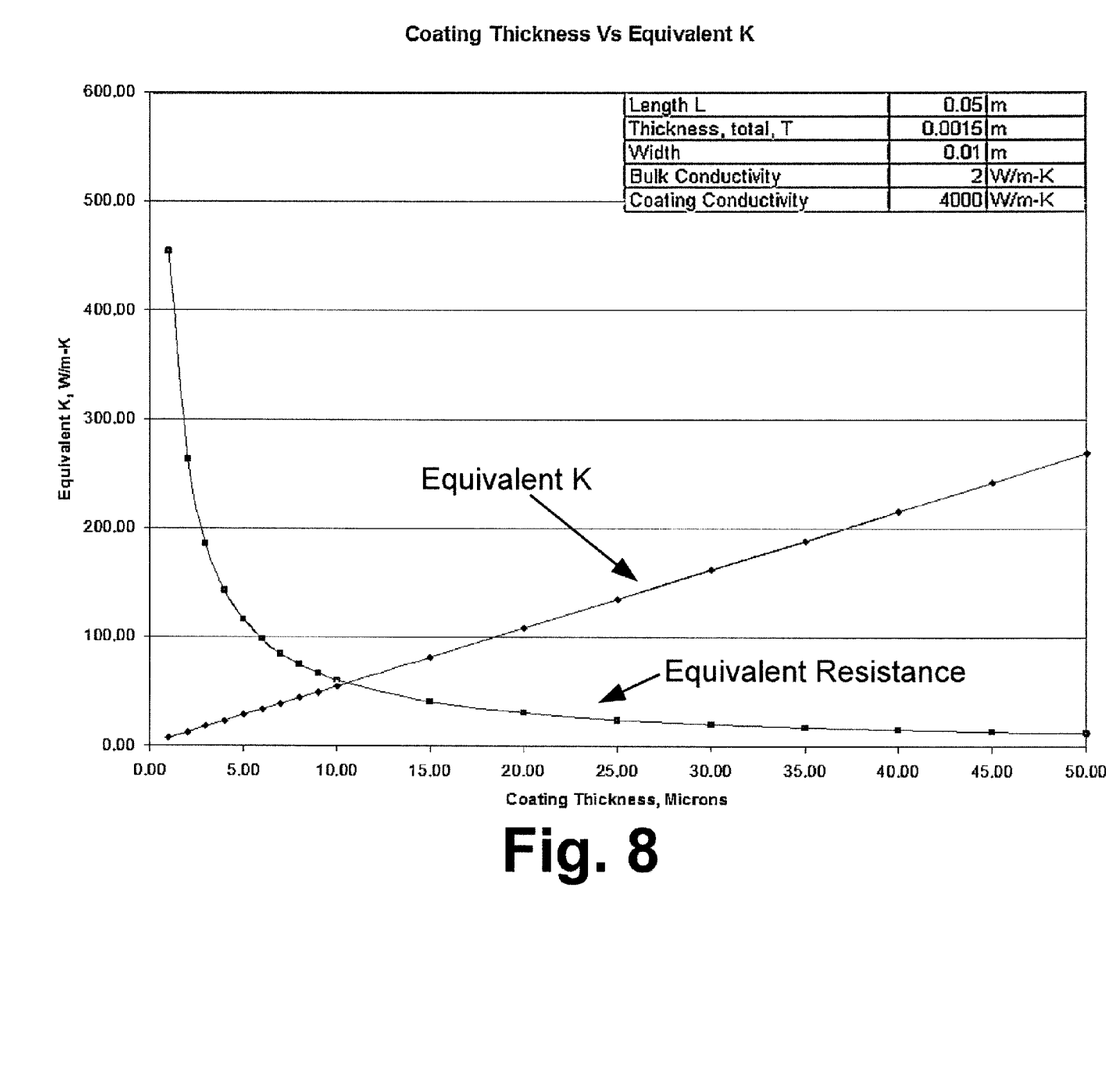
FIG. 8 plots coating thickness versus equivalent K data for a simplified "slab" type heat sink.

With reference to FIG. 8, simulation data are shown for optimizing the thickness of the thermally conductive layer for a material thermal conductivity of 4000 W/mK. The heat sink body in this simulation has a material thermal conductivity of 2 W/mK, but it is found that the results are only weakly dependent on this value. The values of FIG. 8 are for a simplified "slab" heat sink having length 0.05 m, thickness 0.0015 m, and width 0.01 meters, with the thermally conductive material coating both sides of the slab. It is seen that for a thermally conductive layer thickness of more than about 15-20 microns, the equivalent resistance becomes very weakly dependent on the thickness. Thus, a thin layer of a few tens of microns or less is sufficient to provide steady state performance related to heat conduction and subsequent heat removal to the ambient via radiation and convection that is comparable with the performance of a bulk metal heat sink.

In general, the sheet thermal conductance of the thermally conductive layer 14 should be high enough to ensure the heat from the LED devices 32 is spread uniformly across the heat radiating/convecting surface area. In simulations performed by the inventors (such as that of FIG. 8), it has been found that the performance improvement with increasing thickness of the thermally conductive layer 14 (for a given material thermal conductivity) flattens out once the thickness exceeds a certain level (or, more precisely, the performance versus thickness curve decays approximately exponentially). Without being limited to any particular theory of operation, it is believed that this is due to the heat sinking to the ambient becoming limited at higher thicknesses by the radiative/convectivethermal resistance $R_{convection}$ and $R_{IR}$ rather than by the thermal resistance $R_{conduction}$ of the heat transfer through the thermally conductive layer. Said another way, the series thermal resistance $R_{conduction}$ becomes negligible compared with $R_{convection}$ and $R_{IR}$ at higher layer thicknesses.

Figure 9:
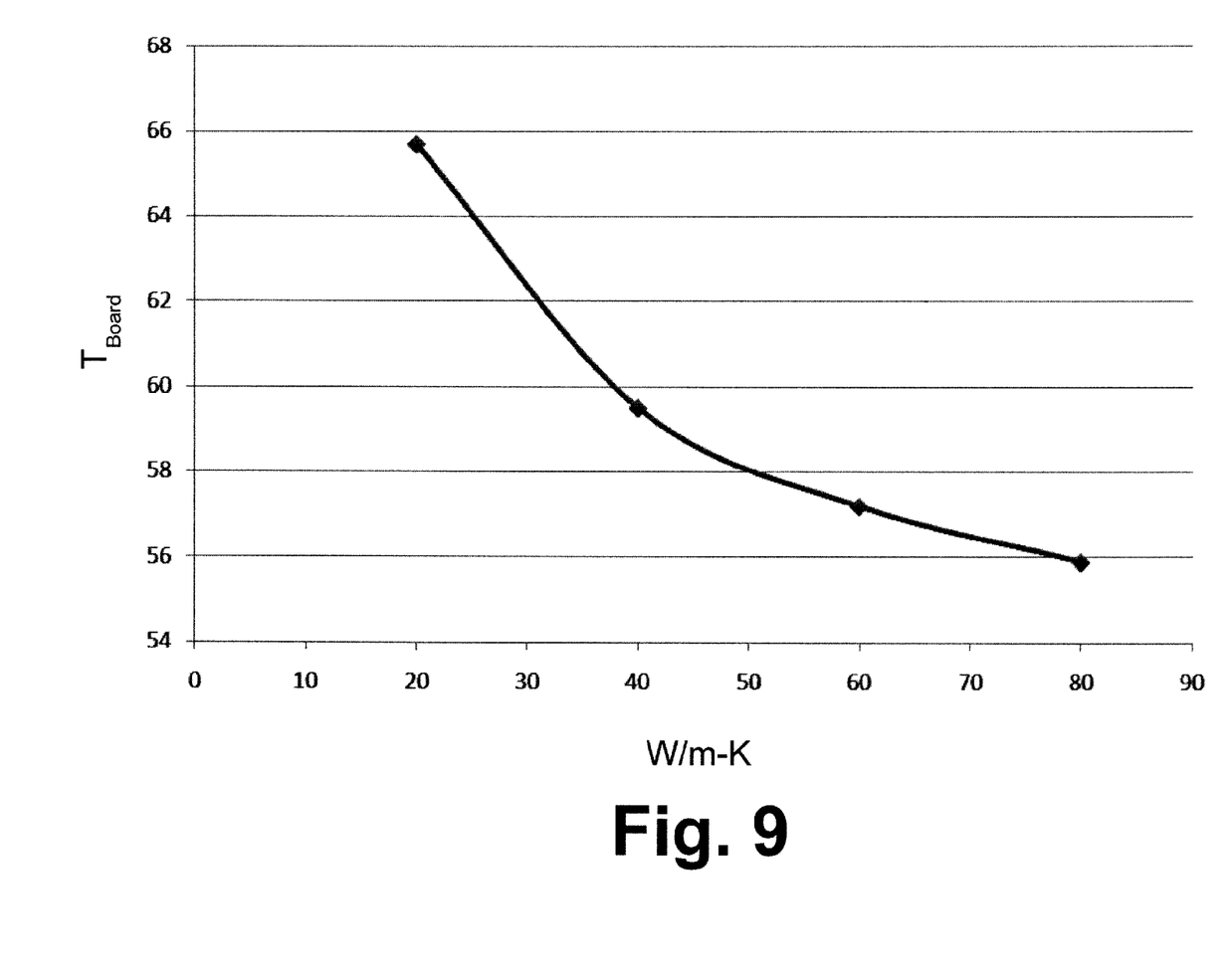
FIGS. 9 and 10 show thermal performance as a function of material thermal conductivity for a bulk metal heat sink.
Figure 10:
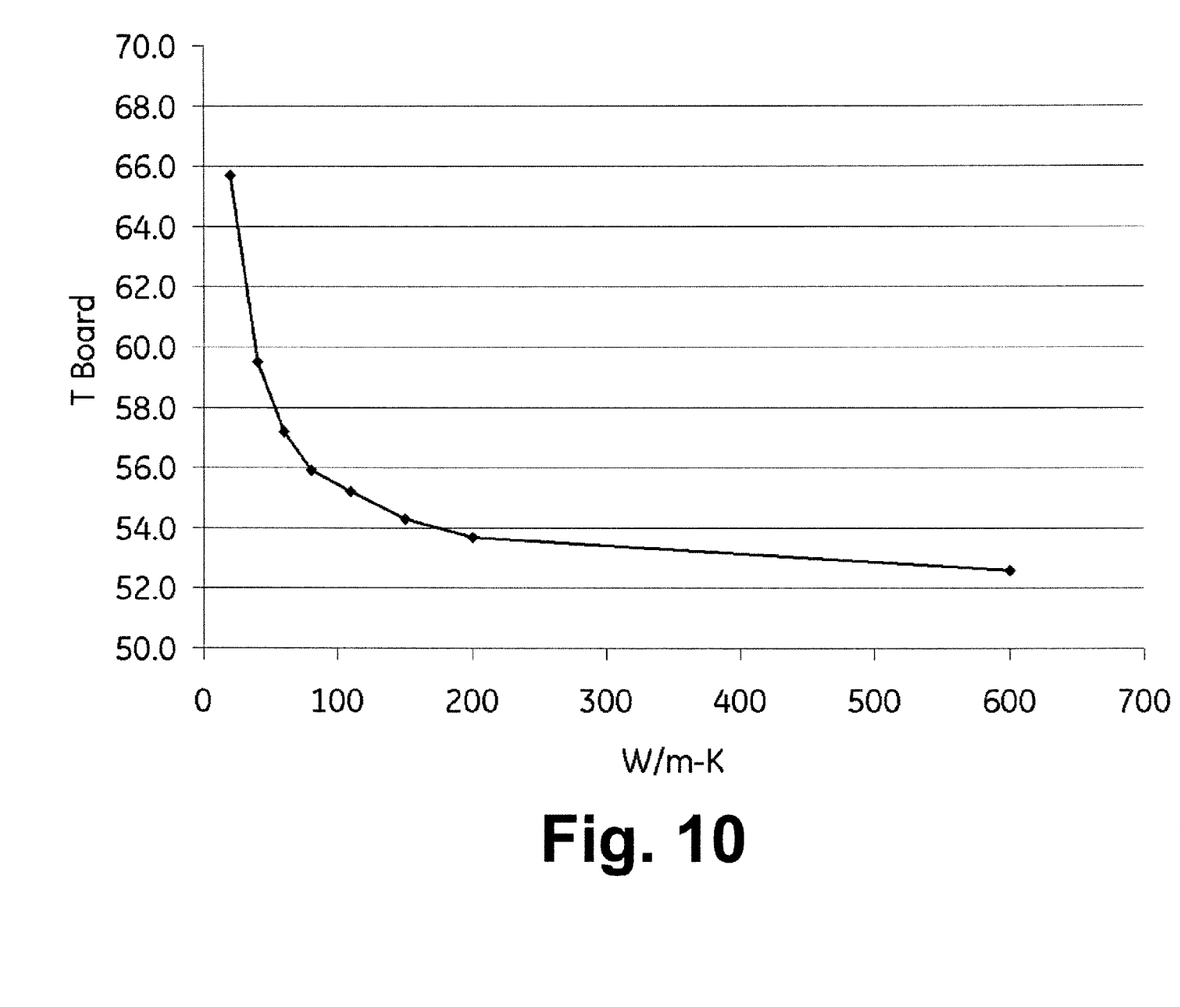

With reference to FIGS. 9 and 10, similar performance flattening with increasing material thermal conductivity is seen in thermal simulations of a bulk metal heat sink. FIG. 9 shows results obtained by simulated thermal imaging of a bulk heat sink for four different material thermal conductivities: 20 W/m·K; 40 W/m·K; 60 W/m·K; and 80 W/m·K. The LED board ("chip-on-board", i.e. CoB or $T_{board}$) temperature for each simulation is plotted in FIG. 9. It is seen that the CoB temperature drop begins to level off at 80 W/m·K. FIG. 10 plots CoB temperature versus material thermal conductivity of the bulk heat sink material for thermal conductivities out to 600 W/m·K, which shows substantial performance flattening by the 100-200 W/m·K range. Without being limited to any particular theory of operation, it is believed that this is due to the heat sinking to the ambient becoming limited at higher (bulk) material conductivities by the radiative/convectivethermal resistance $R_{convection}$ and $R_{IR}$ rather than by the thermal resistance $R_{conduction}$ of the heat transfer through the thermally conductive layer. Said another way, the series thermal resistance becomes negligible compared with $R_{convection}$ and $R_{IR}$ at high (bulk) material thermal conductivity.

Based on the foregoing, in some contemplated embodiments the thermally conductive layer 14 has a thickness of 500 micron or less and a thermal conductivity of 50 W/m·K or higher. However, because the CNT layer can have thermal conductivity exceeding 50 W/m·K by orders of magnitude (see, e.g., Berber et al. supra), a substantially thinner CNT layer can be used. For example, aluminum typically has a (bulk) thermal conductivity of about 100 W/m·K. From FIG. 8, it is seen that heat sinking performance exceeding that of a bulk aluminum heat sink is achievable for a 4000 W/m·K CNT layer having a thicknesses of about 20 microns or thicker. Scaling in accordance with the thermal sheet conductivity $K_s = \sigma \cdot d$ (in this example $\sigma = 4000$ W/m·K and d=20 μm, yielding $K_s = 0.08$ W/K), heat sinking performance exceeding that of a bulk aluminum heat sink is achievable for a 1000 W/m·K CNT layer having a thicknesses of about 80 microns, or for an 800 W/m·K CNT layer having a thicknesses of about 100 microns, or for a 400 W/m·K CNT layer having a thicknesses of about 200 microns, or so forth. For a given CNT layer thickness, increasing the CNT layer thermal conductivity (for example, by increasing the density of carbon nanotubes in the layer, or by using carbon nanotubes of higher individual thermal conductivity) increases heat sinking performance. Similarly, for a given CNT layer thermal conductivity, increasing the CNT layer thickness increases heat sinking performance.

Figure 11:
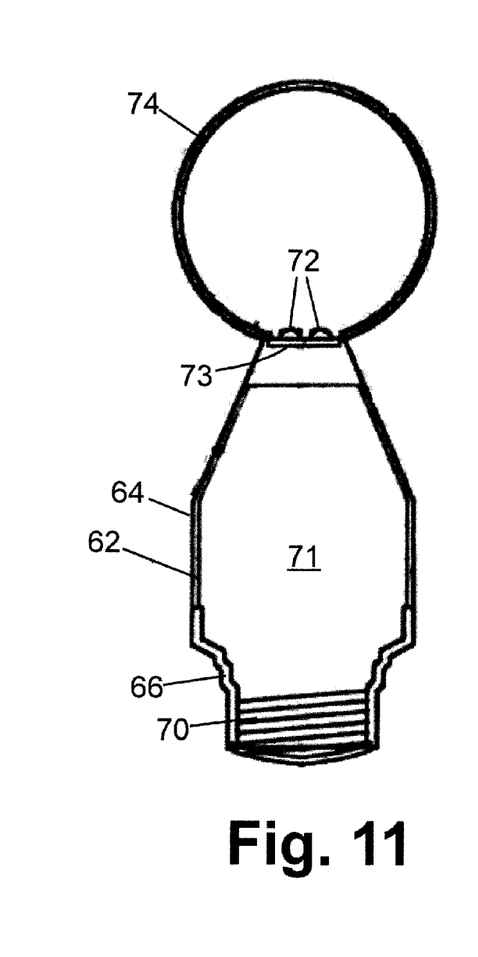
FIG. 11 diagrammatically shows a side sectional view of an "A-line bulb" lamp incorporating a heat sink as disclosed herein.
Figure 12:
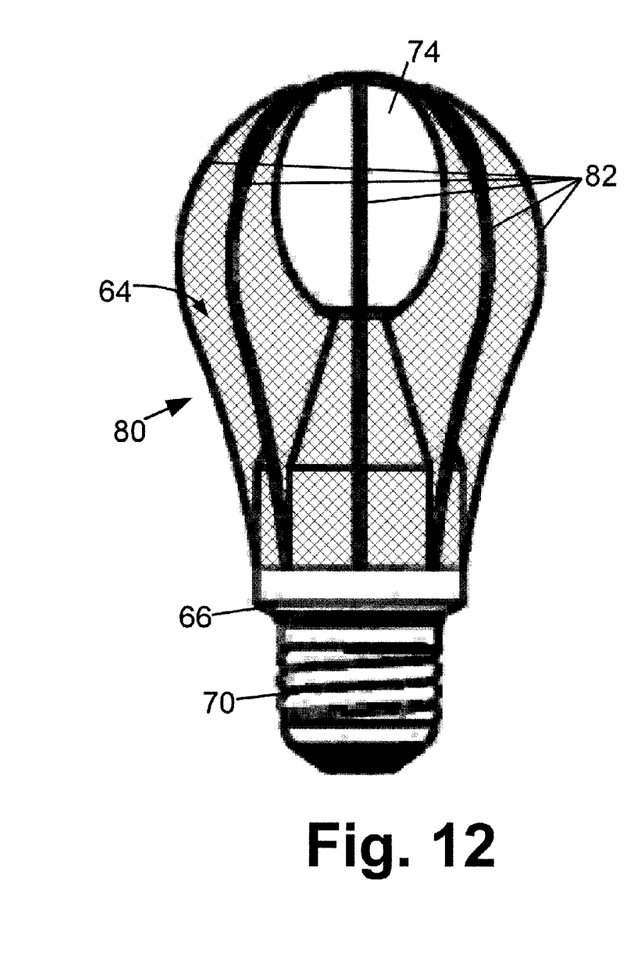
FIG. 12 diagrammatically shows a side perspective view of a variation of the "A-line bulb" lamp of FIG. 9, in which the heat sink includes fins.

With reference to FIGS. 11 and 12, the disclosed heat sink aspects can be in incorporated into various types of LED-based lamps.

FIG. 11 shows a side sectional view of an "A-line bulb" lamp of a type that is suitable for retrofitting incandescent A-line bulbs. A heat sink body 62 forms a structural foundation, and may be suitably fabricated as a molded plastic element, for example made of a polymeric material such as poly (methyl methacrylate), nylon, polyethylene, epoxy resin, polyisoprene, sbs rubber, polydicyclopentadiene, polytetrafluoroethulene, poly(phenylene sulfide), poly(phenylene oxide), silicone, polyketone, thermoplastics, or so forth. A thermally conductive layer 64 comprising a CNT layer disposed on the heat sink body 62. More generally, the thermally conductive layer 64 may be a fullerene layer comprising fullerenes (such as carbon nanotubes, Buckminster fullerenes also known as "Buckyballs", Icosahedral fullerenes, or so forth) disposed in a polymeric host. The thermally conductive layer 64 can be manufactured in the same way as the thermally conductive layer 14 of the MR/PAR lamp embodiments of FIGS. 3-5 and 7.

A lamp base section 66 is secured with the heat sink body 62 to form the lamp body. The lamp base section 66 includes a threaded Edison base 70 similar to the Edison base 40 of the MR/PAR lamp embodiments of FIGS. 3-5 and 7. In some embodiments the heat sink body 62 and/or the lamp base section 66 define a hollow region 71 that contains electronics (not shown) that convert electrical power received at the Edison base 70 into operating power suitable for driving LED devices 72 that provide the lamp light output. The LED devices 72 are mounted on a metal core printed circuit board (MCPCB) or other heat-spreading support 73 that is in thermal communication with the thermally conductive layer 64. Good thermal coupling between the heat spreader 73 and the thermally conductive layer 64 may optionally be enhanced by soldering, thermally conductive adhesive, or so forth.

To provide a substantially omnidirectional light output over a large solid angle (e.g., at least $2\pi$ steradians) a diffuser 74 is disposed over the LED devices 72. In some embodiments the diffuser 74 may include (e.g., be coated with) a wavelength-converting phosphor. For LED devices 72 producing a substantially Lambertian light output, the illustrated arrangement in which the diffuser 74 is substantially spherical and the LED devices 72 are located at a periphery of the diffuser 74 enhances omnidirectionality of the output illumination.

With reference to FIG. 12, a variant "A-line bulb" lamp is shown, which includes the base section 66 with Edison base 70 and the diffuser 74 of the lamp of FIG. 11, and also includes the LED devices 72 (not visible in the side view of FIG. 12). The lamp of FIG. 12 includes a heat sink 80 analogous to the heat sink 62, 64 of the lamp of FIG. 11, and which has a heat sink body (not visible in the side view of FIG. 12) that is coated with the thermally conductive layer 64 (indicated by cross-hatching in the side perspective view of FIG. 12) comprising a CNT layer disposed on the heat sink body. The lamp of FIG. 12 differs from the lamp of FIG. 11 in that the heat sink body of the heat sink 80 is shaped to define fins 82 that extend over portions of the diffuser 74. Instead of the illustrative fins 82, the heat sink body can be molded to have other heat radiation/convection/surface area enhancing structures.

In the embodiment of FIG. 12, it is contemplated for the heat sink body of the heat sink 80 and the diffuser 74 to comprise a single unitary molded plastic element. In this case, however, the single unitary molded plastic element should be made of an optically transparent or translucent material (so that the diffuser 74 is light-transmissive). Additionally, if the CNT layer 64 is optically absorbing for the lamp light output, then as shown in FIG. 12 the CNT layer 64 should coat only the heat sink 80, and not the diffuser 74. This can be accomplished by suitable masking of the diffuser surface during the spray coating, for example.

Figure 13:
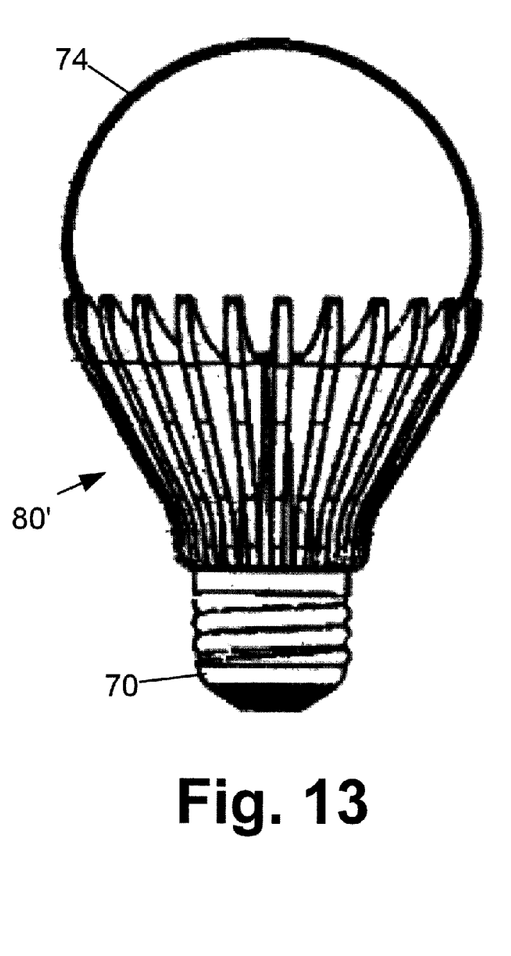
FIGS. 13 and 14 diagrammatically show side perspective views of additional embodiments of finned "A-line bulb" lamps.
Figure 14:
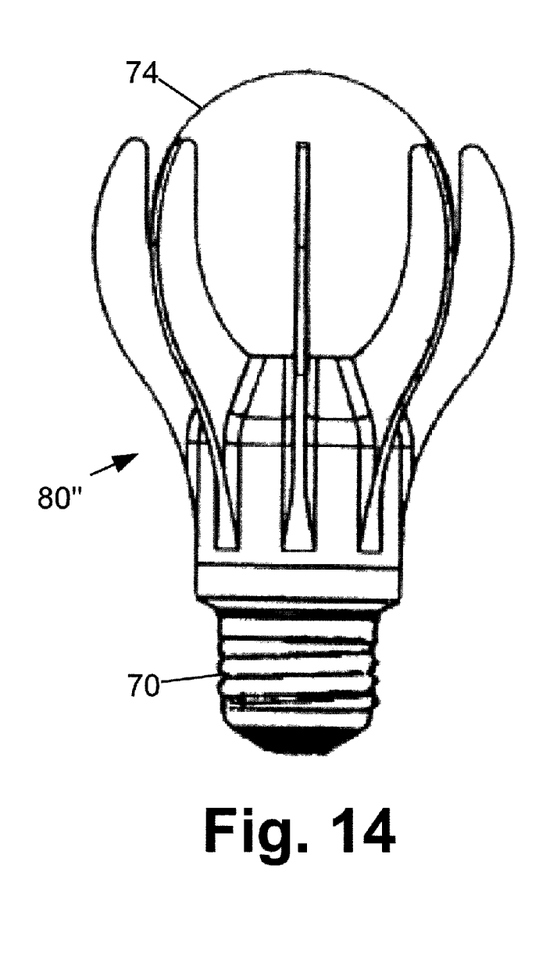

FIGS. 13 and 14 show alternative heat sinks 80', 80" that are substantially the same as the heat sink 80, except that the fins do not extend as far over the diffuser 74. In these embodiments the diffuser 74 and the heat sink body of the heat sink 80', 80" may be separately molded (or otherwise separately fabricated) elements, which may simplify the processing to dispose the CNT layer 64 on the heat sink body.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An apparatus comprising an LED-based lamp including:
a light emitting diode (LED) module having one or more LED devices;
a heat sink comprising a plurality of plastic fins including a thermally conductive layer comprising at least one of fullerenes and nanotubes disposed in a polymeric host, said thermally conductive layer disposed on said plastic fins;
wherein the LED module is in thermal communication with the heat sink.

2. The apparatus of claim 1, wherein the thermally conductive layer has a thickness of 500 micron or less and a thermal conductivity of 50 Wm·K or higher.

3. The apparatus of claim 1, wherein the thermally conductive layer has a thickness of 200 micron or less and a thermal conductivity of 400 W/m·K or higher.

4. The apparatus of claim 3, wherein the thickness of the thermally conductive layer is 100 microns or less.

5. The apparatus of claim 3, wherein the thickness of the thermally conductive layer is 80 microns or less.

6. The apparatus of claim 1, wherein the thermally conductive layer comprises carbon nanotubes disposed in a polymeric host.

7. The apparatus of claim 6, wherein the carbon nanotubes are biased toward a selected orientation parallel with the plane of the thermally conductive layer.

8. The apparatus of claim 1, wherein the heat sink body has relatively lower thermal conductivity and the thermally conductive layer has relatively higher thermal conductivity.

9. The apparatus of claim 1, wherein the heat sink body is thermally insulating.

10. The apparatus of claim 1, wherein a plastic forming said plastic body has a thermal conductivity less than a thermal conductivity of said thermally conductive layer.

11. The apparatus of claim 1, wherein the LED module is in direct contact with said thermally conductive layer.

12. The apparatus of claim 1, wherein the plastic body is comprised of a polymeric material selected from poly (methyl methacrylate), nylon, polyethylene, epoxy, polyisoprene, sbs rubber, polydicyclopentadiene, polytetrafluoroethulene, poly(phenylene sulfide), poly(phenylene oxide), silicone, polyketone, and mixtures thereof.

* * * * *